(12) United States Patent
Wang et al.

(10) Patent No.: US 9,472,392 B2
(45) Date of Patent: Oct. 18, 2016

(54) STEP COVERAGE DIELECTRIC

(71) Applicant: Applied Materials, Inc., Santa Clara, CA (US)

(72) Inventors: Zongbin Wang, Singapore (SG); Shalina Sudheeran, Singapore (SG); Loke Yuen Wong, Singapore (SG); Arvind Sundarrajan, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/610,863

(22) Filed: Jan. 30, 2015

(65) Prior Publication Data

US 2016/0225614 A1    Aug. 4, 2016

(51) Int. Cl.
    *H01L 21/31*    (2006.01)
    *H01L 21/02*    (2006.01)

(52) U.S. Cl.
    CPC ... *H01L 21/02164* (2013.01); *H01L 21/02211* (2013.01); *H01L 21/02214* (2013.01); *H01L 21/02216* (2013.01); *H01L 21/02274* (2013.01)

(58) Field of Classification Search
    USPC ........................................................ 438/788
    See application file for complete search history.

(56) References Cited

U.S. PATENT DOCUMENTS

| | | |
|---|---|---|
| 6,090,442 A | 7/2000 | Klaus et al. |
| 6,858,533 B2 | 2/2005 | Chu et al. |
| 7,045,445 B2 | 5/2006 | Kim et al. |
| 7,077,904 B2 | 7/2006 | Cho et al. |
| 7,540,920 B2 | 6/2009 | Singh et al. |
| 7,749,574 B2 | 7/2010 | Mahajani et al. |
| 8,524,612 B2 | 9/2013 | Li et al. |
| 2003/0023113 A1 | 1/2003 | Druzkowski et al. |
| 2004/0180557 A1 | 9/2004 | Park et al. |
| 2006/0090694 A1 | 5/2006 | Cho et al. |
| 2009/0104790 A1* | 4/2009 | Liang ................. C23C 16/34 438/788 |
| 2009/0209081 A1 | 8/2009 | Matero et al. |
| 2010/0221428 A1 | 9/2010 | Dussarrat |
| 2011/0207283 A1* | 8/2011 | Haukka ............... C23C 16/402 438/381 |

FOREIGN PATENT DOCUMENTS

CN      101171366 A     4/2008

OTHER PUBLICATIONS

Office Action dated Feb. 28, 2015 in Chinese Patent Application No. 2011800446924, English Translated Search Report, 10 pages.

(Continued)

*Primary Examiner* — Timor Karimy
(74) *Attorney, Agent, or Firm* — Kilpatrick Townsend & Stockton LLP

(57) ABSTRACT

Silicon oxide is deposited with improved step coverage by first exposing a patterned substrate to a silicon-containing precursor and then to an oxygen-containing precursor or vice versa. Plasma excitation is used for both precursors. Exposing the precursors one-at-a-time avoids disproportionate deposition of silicon oxide near the opening of a high aspect ratio gap on a patterned substrate. The plasma-excited precursors exhibit a lower sticking coefficient and/or higher surface diffusion rate in regions already adsorbed and therefore end up depositing silicon oxide deep within the high aspect ratio gap to achieve the improvement in step coverage.

16 Claims, 3 Drawing Sheets

(56) References Cited

OTHER PUBLICATIONS

Morishita, S. et al., "Atomic-Layer Chemical-Vapor-Deposition of $SiO_2$ by Cyclic Exposures of $CH_3OSi(NCO)$ and $H_2O_2$", Jpn. J. Appl. Phys., Oct. 1995, vol. 34, Part 1, No. 10, pp. 5738-5742.

Notification of Transmittal of the International Search Report and the Written Opinion of the International Searching Authority, or the Declaration; International Search Report and Written Opinion of the International Searching Authority for corresponding International Application No. PCT/US2011/050391 mailed on Mar. 28, 2012, 9 pages.

* cited by examiner

STEP COVERAGE DIELECTRIC

FIELD

The subject matter herein relates to deposition of silicon oxide.

BACKGROUND

Silicon oxide dielectric layers form resilient interfaces with silicon and provide high dielectric strength and a relatively low dielectric constant. These traits result in heavy use of silicon oxide for insulating electrically active features from one another. Two conventional methods for depositing a silicon oxide layer include: (1) oxidation process wherein silicon is oxidized at relatively high temperatures (e.g., sometimes more than 1000° C.); and (2) a chemical vapor deposition (CVD) process wherein the silicon and oxygen sources are introduced into a chamber and exposed to energy (e.g., heat) to form a silicon oxide layer. Silicon oxide CVD processes typically occur at temperatures ranging from 600° C. to 800° C. or below 450° C. depending on the application. While satisfactory for larger integrated circuit linewidths, these methods can cause diffusion at interfaces due to the high deposition temperature, thereby degrading electrical characteristics of miniature electrical devices.

In addition to lower substrate temperatures, thin layers used in semiconductor devices will increasingly require atomic layer control during deposition due to the decreasing linewidths. These thin layers will also be required to have excellent step coverage. Silicon precursors have been interleaved with oxygen precursors to deposit silicon oxide, but predominantly at high substrate temperatures or by including a halogen in the precursors.

Methods are needed to broaden the process space in which silicon oxide may be deposited with atomic layer control.

SUMMARY

Silicon oxide is deposited with improved step coverage by first exposing a patterned substrate to a silicon-containing precursor and then to an oxygen-containing precursor or vice versa. Plasma excitation is used for both precursors. Exposing the precursors one-at-a-time avoids disproportionate deposition of silicon oxide near the opening of a high aspect ratio gap on a patterned substrate. The plasma-excited precursors exhibit a lower sticking coefficient and/or higher surface diffusion rate in regions already adsorbed and therefore end up depositing silicon oxide deep within the high aspect ratio gap to achieve the improvement in step coverage.

Embodiments include methods of forming a silicon oxide layer. The methods include placing a patterned substrate in a substrate processing region of a substrate processing chamber. The patterned substrate includes a high aspect ratio gap. The methods further include (i) flowing a silicon-containing precursor into the substrate processing region and forming a silicon-containing plasma by applying a high-frequency plasma power and optionally a low-frequency plasma power to the substrate processing region, (ii) optionally removing process effluents including unreacted silicon-containing precursor from the substrate processing region, (iii) flowing an oxygen-containing precursor into the substrate processing region and forming an oxygen-containing plasma by applying a high-frequency plasma power and optionally a low-frequency plasma power to the substrate processing region, and (iv) optionally removing process effluents including unreacted oxygen-containing precursor from the substrate processing region.

The silicon-containing plasma power may be between 500 watts and 2,000 watts. The silicon-containing precursor may include one or more of dimethylsilane, trimethylsilane, tetramethylsilane, tetramethylorthosilicate, tetraethylorthosilicate, octamethyltrisiloxane, octamethylcyclotetrasiloxane, tetramethyldimethyldimethoxydisilane, tetramethylcyclotetrasiloxane, dimethyldimethoxysilane, diethoxymethylsilane, methyltriethoxysilane, triethoxysilane, phenyldimethylsilane and phenylsilane. The oxygen-containing precursor may include one or more of molecular oxygen ($O_2$), ozone ($O_3$), nitric oxide, nitrogen dioxide and nitrous oxide. Operations (i)-(iv) may be repeated an integral number of times (e.g. greater than ten times) to achieve a target thickness of silicon oxide. A depth of the high aspect ratio gap may be greater than one micron. A temperature of the patterned substrate may be maintained at below 200° C. during operations i) and iii) or during operations i-iv. Operations i, ii, iii, and iv may occur in the recited order. A pressure within the substrate processing region may be between 0.5 Torr and 20 Torr during operation i.

Embodiments include methods of forming a silicon oxide layer. The methods include placing a patterned substrate in a substrate processing region of a substrate processing chamber. The patterned substrate includes a high aspect ratio gap. The methods further include (i) flowing an oxygen-containing precursor into the substrate processing region and forming an oxygen-containing plasma by applying an oxygen-containing plasma power to the substrate processing region, (ii) removing process effluents including unreacted oxygen-containing precursor from the substrate processing region, (iii) flowing a silicon-containing precursor into the substrate processing region and forming a silicon-containing plasma by applying a silicon-containing plasma power to the substrate processing region, and (iv) removing process effluents including unreacted silicon-containing precursor from the substrate processing region.

Each iteration of operations i-iv may deposit a very thin layer of silicon oxide on the patterned substrate. The high aspect ratio gap may have a width of between 1 μm and 15 μm for through-silicon via (TSV) applications or may be less than 50 nm or less than 25 nm for other applications, in embodiments. A pressure within the substrate processing region may be between 0.5 Torr and 20 Torr during operation i. The oxygen-containing plasma power is between 500 watts and 2,000 watts.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

DESCRIPTION OF THE DRAWINGS

A further understanding of the nature and advantages of the embodiments may be realized by reference to the remaining portions of the specification and the drawings.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Silicon oxide is deposited with improved step coverage by first exposing a patterned substrate to a silicon-containing precursor and then to an oxygen-containing precursor or vice versa. Plasma excitation is used for both precursors. Exposing the precursors one-at-a-time avoids disproportionate deposition of silicon oxide near the opening of a high aspect ratio gap on a patterned substrate. The plasma-excited precursors exhibit a lower sticking coefficient and/or higher surface diffusion rate in regions already adsorbed and therefore end up depositing silicon oxide deep within the high aspect ratio gap to achieve the improvement in step coverage.

The dielectric layers formed according to the methods described herein may have improved step coverage. A benefit of these dielectric layers is a reduction in electrical leakage current especially in high aspect ratio gaps. The electrical leakage benefit arises from an improvement of step coverage when forming layers according to the methods described. Another benefit of the methods presented herein involves a reduction in patterned substrate temperature during deposition. Tetraethylorthosilicate ordinarily requires a high (e.g. >350° C.) patterned substrate temperature during deposition which may make typical silicon oxide deposition methods undesirable from a thermal budget standard as well.

Figure 1:
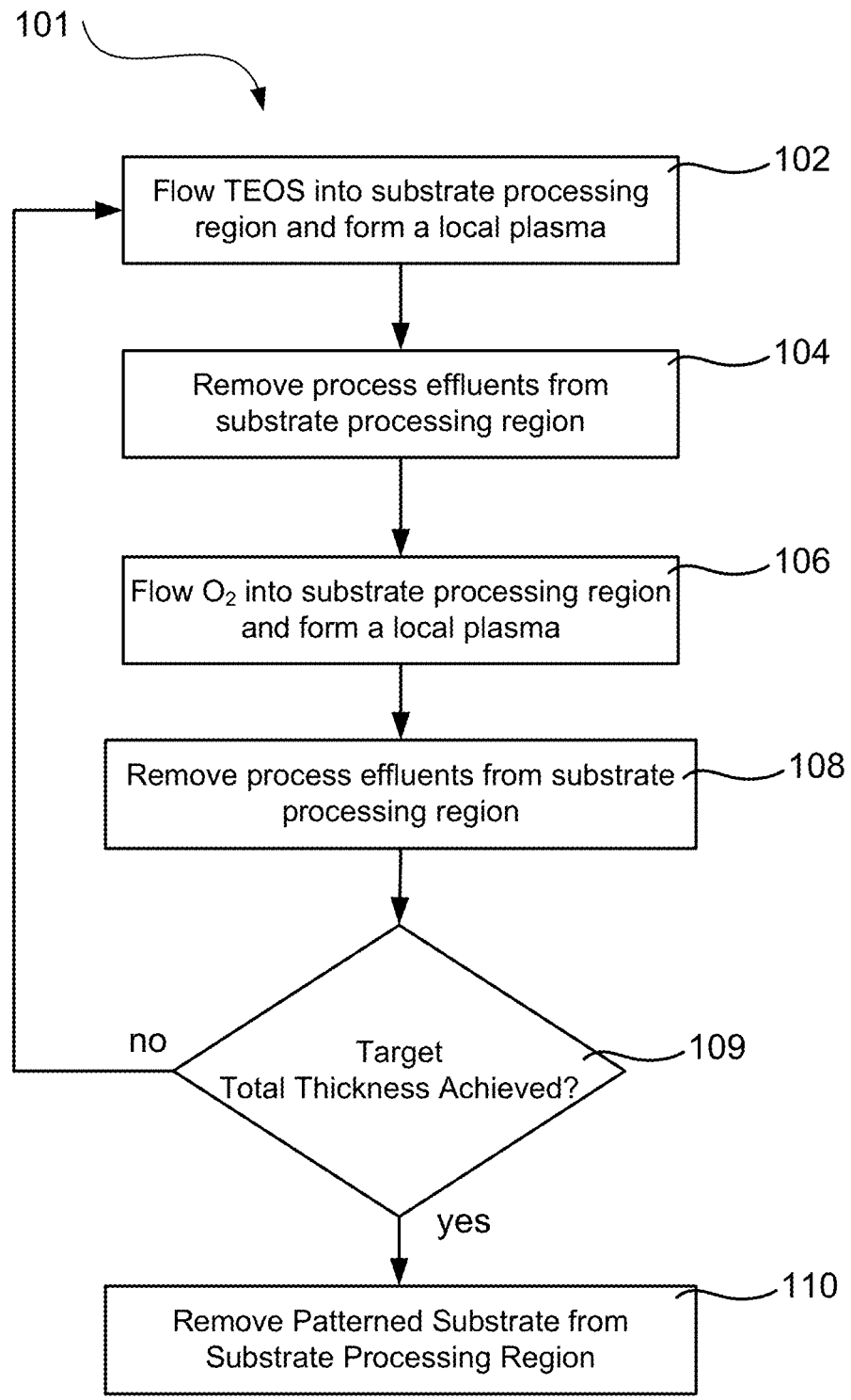
FIG. 1 is a flow chart of a silicon oxide deposition process according to embodiments.
Figure 2:
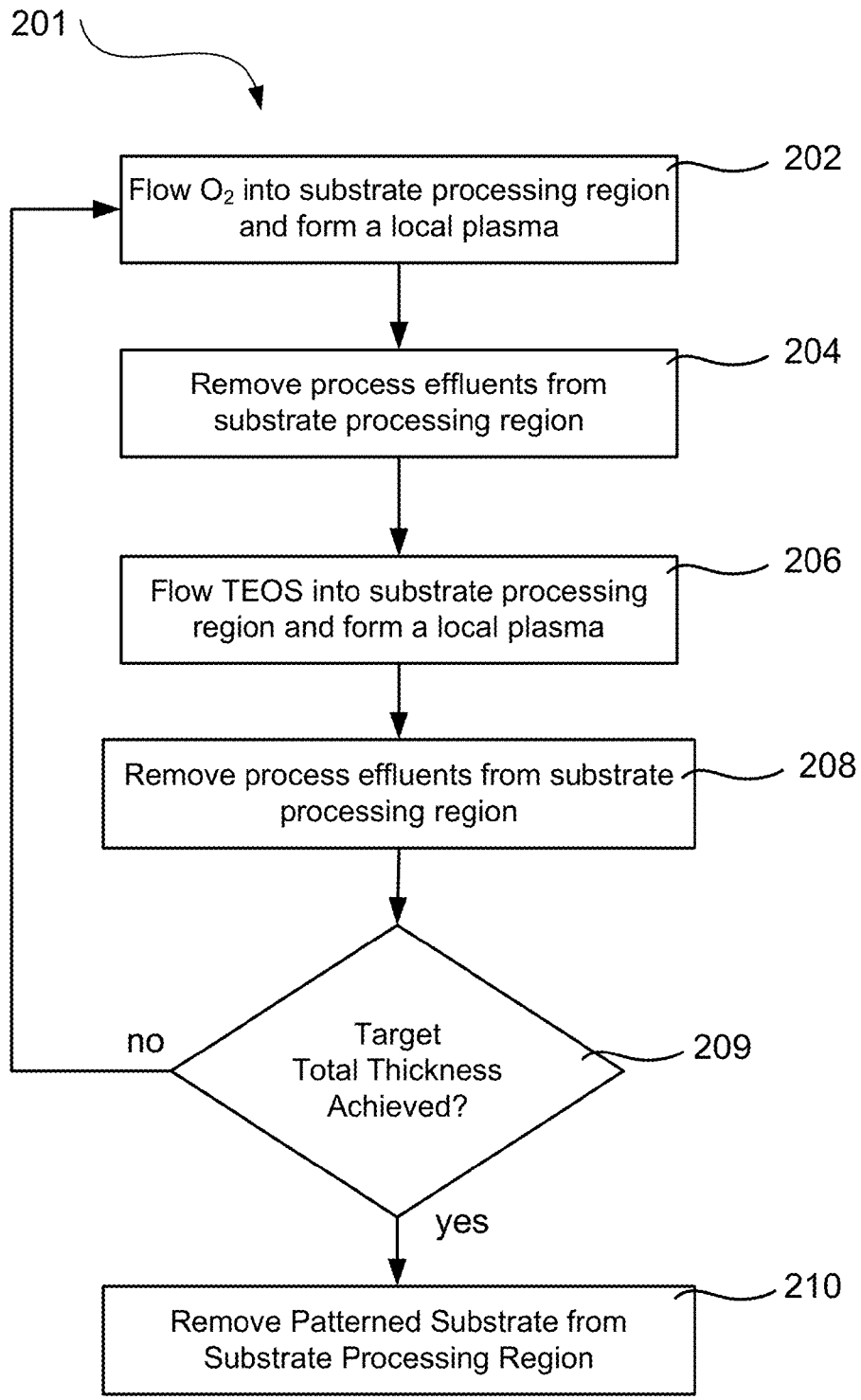
FIG. 2 is a flow chart of a silicon oxide deposition process according to embodiments.
Figure 3A:
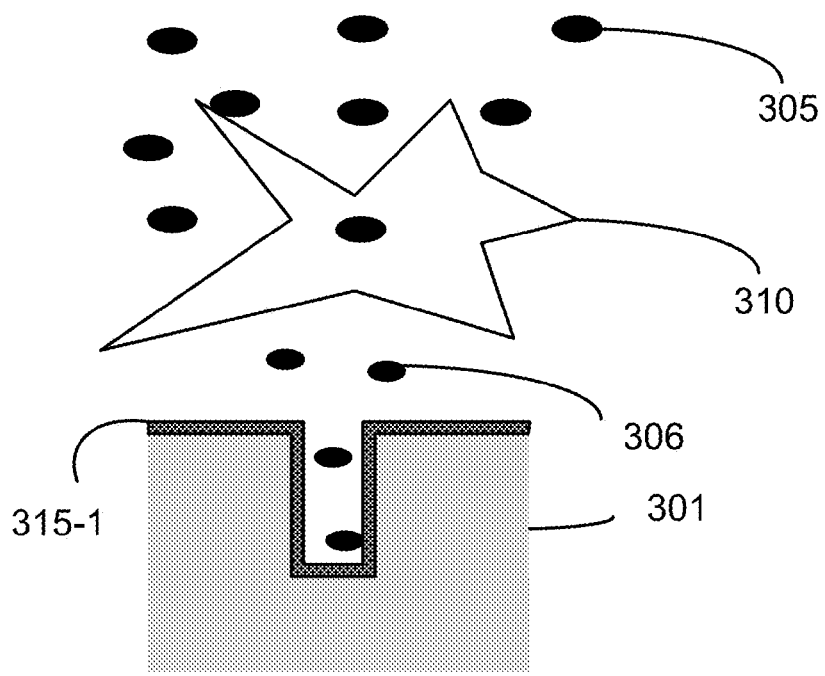
FIGS. 3A and 3B are cross-sectional views of a patterned substrate during a silicon oxide deposition process according to embodiments.
Figure 3B:
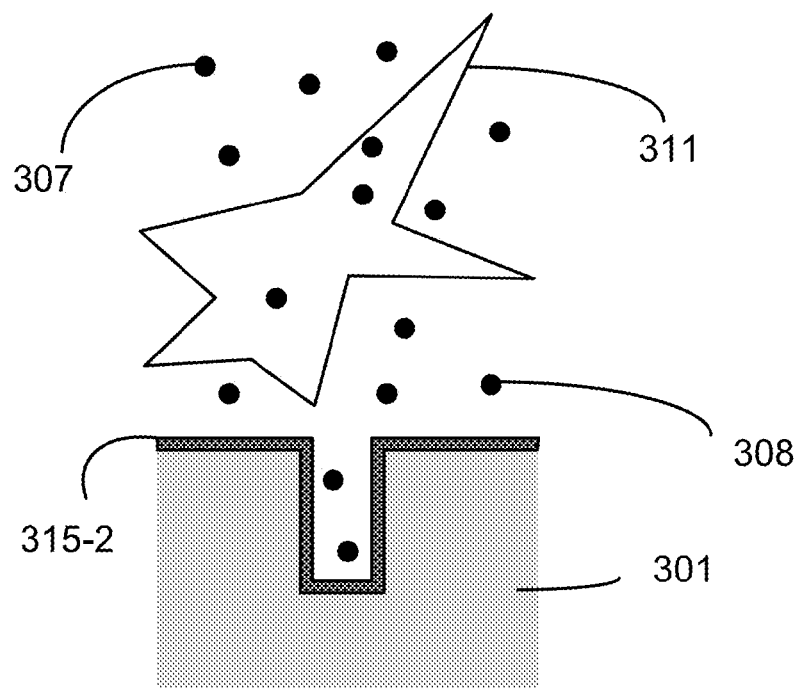

To better understand the subject matter described herein, reference is now made to FIGS. 1-2 which are flowcharts showing exemplary selected operations in forming silicon oxide layers according to embodiments. Concurrent reference will be made to FIGS. 3A-3B which are cross-sectional views of a patterned substrate during a silicon oxide deposition process according to embodiments. Method 101 includes flowing a silicon-containing precursor 305 into a substrate processing region containing a patterned substrate (operation 102). Patterned substrate 301 may have one or more exposed materials (e.g. crystalline silicon) and has a high aspect ratio gap as represented in FIGS. 3A-3B. The silicon-containing precursor 305 may be one of a variety of precursors which contain both silicon and oxygen but may contain other elements in embodiments. The silicon-containing precursor 305 may include one or more of dimethylsilane, trimethylsilane, tetramethylsilane, tetramethylorthosilicate, tetraethylorthosilicate, octamethyltrisiloxane, octamethylcyclotetrasiloxane, tetramethyldimethyldimethoxydisilane, tetramethylcyclotetrasiloxane, dimethyldimethoxysilane, diethoxymethylsilane, methyltriethoxysilane, triethoxysilane, phenyldimethylsilane and phenylsilane.

The silicon-containing precursor 305 enters the substrate processing region of the substrate processing chamber and is excited in a local plasma (silicon-containing plasma 310). Silicon-containing plasma 310 excites silicon-containing precursor 305 to form silicon-containing plasma effluents 306 which include some precursor, precursor fragments, ionized fragments. Patterned substrate 301 is exposed to silicon-containing plasma effluents 306 in operation 102. Exposing the substrate to silicon-containing plasma effluents 306 results in deposition of a high step coverage silicon oxide layer 315-1. Silicon-containing plasma effluents 306 are thought to form high mobility adsorbate structures which enable the formation of high step coverage silicon oxide layer 315-1.

The flow of silicon-containing precursor 305 may be halted, in embodiments, and unreacted silicon-containing plasma effluents 306 and other process effluents are removed from the substrate processing region in operation 104. The process effluents may be removed by flowing inert species into the substrate processing region to flush the process effluents away from the processing region. Alternatively or in combination, the process effluents may be pumped away through a pumping port to a pumping system.

Method 101 further includes flowing an oxygen-containing precursor 307 into the substrate processing region in operation 106. Oxygen-containing precursor 307 includes oxygen and may consist of oxygen or consist of oxygen and nitrogen in embodiments. Oxygen-containing precursor 307 may include or consist of one or more of molecular oxygen ($O_2$), ozone ($O_3$), nitric oxide, nitrogen dioxide and nitrous oxide. A local plasma is again formed in the substrate processing region and is referred to as oxygen-containing plasma 311 to distinguish it from the local plasma of operation 102. The oxygen-containing precursor 307 is transformed in oxygen-containing plasma 311 to include excited chemical fragments and combinations (some neutral and some ionized) as before. Oxygen-containing plasma effluents 308 are formed in the plasma (representing all the excited species formed) and react with patterned substrate 301 to deposit additional material on, for example, the high aspect ratio gap in operation 106. In operation 106, additional material is supplied to silicon oxide layer 315-1 to form silicon oxide layer 315-2 and chemical bonds may broken or rearranged in the process.

The flow of oxygen-containing precursor 307 may be halted and unreacted oxygen-containing plasma effluents 308 and other process effluents are removed from the substrate processing region in operation 108. As before, the process effluents may be removed by flowing inert species into the substrate processing region to flush the process effluents away from the processing region. Alternatively or in combination, the process effluents may be pumped away through a pumping port to a pumping system.

A thickness may be sufficient after one cycle of operations 102-108 but more cycles may be desired. Operation 109 is a decision which may result in operations 102-108 being repeated or may result in the deposition being terminated and then patterned substrate 301 may be removed from the substrate processing region in operation 110. Operation 109 may simply be a de facto comparison between the number of cycles (102-108) already completed and a recipe entry of a desired, predetermined number of deposition cycles. On the other hand, operation 109 may involve a nondestructive measurement of a thickness of silicon oxide layer 315-2 and a comparison and determination regarding whether additional deposition is desirable. Silicon oxide layers produced according to all the methods presented herein, regardless of how few or how many cycles, will be referred to herein as containing "silicon oxide" despite the bonding arrangement deviating from typical $SiO_2$ bonding arrangements especially for very thin layers. Silicon oxide layers 315 (either 315-1 or 315-2) may comprise or consist of silicon and oxygen in embodiments. Silicon oxide layers may be formed using an integral number of cycles (a cycle being operations 102-108, collectively) which number more than five, more than ten, more than twenty or more than thirty according to embodiments.

In FIG. 2, method 201 includes flowing an oxygen-containing precursor into a substrate processing region containing a patterned substrate (operation 202). The patterned substrate may have one or more exposed materials and a high aspect ratio gap. The oxygen-containing precursor may be one of a variety of precursors which contain oxygen, consist of oxygen, or may contain other elements in embodiments. The oxygen-containing precursor may comprise or consist of the precursors listed for method 101.

The oxygen-containing precursor enters the substrate processing region of the substrate processing chamber and is excited in a local plasma (an "oxygen-containing" plasma). Oxygen-containing plasma excites oxygen-containing precursor to form oxygen-containing plasma effluents which include ionized and/or excited precursors and fragments. The patterned substrate is exposed to the oxygen-containing plasma effluents in operation 202. Operation 202 may simply be described as oxygen-terminating the surface of the patterned substrate in embodiments. The flow of the oxygen-containing precursor may be halted, in embodiments, and unreacted oxygen-containing plasma effluents and other process effluents are removed from the substrate processing region in operation 204. The process effluents may be removed using the means described previously with reference to FIG. 1.

Method 101 further includes flowing a silicon-containing precursor into the substrate processing region in operation 206. The silicon-containing precursor includes silicon and oxygen and may comprise other elements such as hydrogen and carbon in embodiments. A local plasma is again formed in the substrate processing region and is referred to as a silicon-containing plasma to distinguish it from the local plasma of operation 202. The silicon-containing precursor is transformed in a silicon-containing plasma to form silicon-containing plasma effluents as before. The silicon-containing plasma effluents react with the patterned substrate to deposit additional material on, for example, the high aspect ratio gap in operation 206. In operation 206, additional material is supplied to the growing silicon oxide layer. The flow of the silicon-containing precursor may be halted and unreacted silicon-containing plasma effluents and other process effluents are removed from the substrate processing region in operation 208 using the methods described previously.

A thickness may be sufficient after one cycle of operations 202-208 but more cycles may be desired. Operation 209 is a decision which may result in operations 202-208 being repeated or may result in the deposition being terminated and the patterned substrate being removed from the substrate processing region in operation 210. Operation 209 may involve a non-destructive measurement or a predetermined integer number of desired deposition cycles. The silicon oxide layers at any state during or following method 201 may comprise or consist of silicon and oxygen in embodiments. Silicon oxide layers may be formed using an integral number of cycles (e.g. 202-208) which number more than five, more than ten, more than twenty or more than thirty according to embodiments.

A cycle of film formation (four sequential operations 102-108 or four sequential operations 202-208) may form a silicon oxide layer having a thickness between 1 nm and 15 nm or between 2 nm and 10 nm on the substrate according to embodiments. The high aspect ratio gap may have a width of between 1 μm and 15 μm for through-silicon via (TSV) applications or may be less than 50 nm or less than 25 nm for other applications, in embodiments. The substrate temperature may be less than 200° C. during any of the operations of flowing the silicon-containing precursor and flowing the oxygen-containing precursor in embodiments. The substrate temperature may be less than 200° C. during operations 102 and 106, or may be less than 200° C. during operations 102-108, inclusive. Analogously, the substrate temperature may be less than 200° C. during operations 202 and 102, or may be less than 200° C. during operations 202-208, inclusive.

Operations 102 and 206 include applying energy to the silicon-containing precursor in the substrate processing region to generate the plasma effluents. Operations 106 and 202 include applying energy to the oxygen-containing precursor in the substrate processing region to generate the plasma effluents. The plasmas may be generated using known techniques (e.g., radio frequency excitations, capacitively-coupled power or inductively coupled power). In an embodiment, the energy is applied using a capacitively-coupled plasma unit. The plasma power may be between 150 watts and 5,000 watts, between 300 watts and 3,000 watts or between 500 watts and 2,000 watts according to embodiments.

In operations 102 and 206, the silicon-containing precursor (e.g. tetraethylorthosilicate) is supplied at a flow rate of 100 mgm (milligrams per minute) and 10,000 mgm, between 200 mgm and 5,000 mgm, or between 500 mgm and 3,000 mgm or between 5 sccm and 500 sccm, between 10 sccm and 300 sccm, between 25 sccm and 200 sccm or between 50 sccm and 150 sccm as appropriate depending on boiling point of the precursor. In operations 106 and 202, the oxygen-containing precursor (e.g. $O_2$) is supplied at a flow rate of between 100 sccm and 30,000 sccm, between 50 sccm and 20,000 sccm, between 500 sccm and 10,000 sccm or between 1,000 sccm and 7,000 sccm. The pressure within the substrate processing region may be below 50 Torr, below 30 Torr, below 20 Torr or below 15 Torr. The pressure may be above 0.2 Torr, above 0.5 Torr, above 1.5 Torr or above 3 Torr in embodiments. Any of the upper limits on temperature or pressure may be combined with lower limits to form additional embodiments.

An advantage of the processes described herein lies in the formation of silicon oxide even near the corners of a gap near the bottom of the gap or near the opening of the gap. The surface of the interface underneath a silicon oxide layer and the surface of the silicon oxide layer may generally be parallel. A thickness of a silicon oxide layer near the mouth of a gap may be within seven percent, five percent or three percent of a thickness at the bottom of the gap in embodiments.

The dimensions of the gaps on the patterned substrate in all embodiments are now described. A depth:width aspect ratio of the high aspect ratio gap may be at least 4:1, at least 5:1, at least 6:1, at least 8:1 or at least 10:1. A high aspect ratio gap may have a width of more than 1 μm, more than 2 μm, more than 3 μm, or more than 5 μm, in embodiments. The high aspect ratio gap may have a width of less than 15 μm, less than 10 μm, less than 8 μm or less than 5 μm according to embodiments. The high aspect ratio gap may have a depth greater than 1 μm, greater than 5 μm, greater than 10 μm, greater than 20 μm, greater than 35 μm, greater than 50 μm, or greater than 100 μm in embodiments.

In each plasma described herein, the flows of the precursors into the plasma region may further include one or more relatively inert gases such as He, $N_2$, Ar. The inert gas can be used to improve plasma stability, ease plasma initiation, and improve process uniformity. Argon is helpful, as an additive, to promote the formation of a stable plasma. Process uniformity is generally increased when helium is included. These additives are present in embodiments throughout this specification.

Plasma power can be of a variety of frequencies or a combination of multiple frequencies. Plasma may be effected by a plasma power in the radio frequency (RF) range. provided by RF power delivered capacitively between plates positioned under (e.g. a substrate pedestal component) and above the patterned substrate. The RF frequency applied in the exemplary processing system may be low RF frequencies less than about 200 kHz, high RF frequencies between about 10 MHz and about 15 MHz, or microwave frequencies greater than or about 1 GHz in embodiments. Generally speaking, the plasma power may be capacitively-coupled (CCP) or inductively-coupled (ICP) into the substrate processing region in embodiments.

In the preceding description, for the purposes of explanation, numerous details have been set forth to provide an understanding of embodiments of the subject matter described herein. It will be apparent to one skilled in the art, however, that certain embodiments may be practiced without some of these details, or with additional details.

As used herein "substrate" may be a support substrate with or without layers formed thereon. The patterned substrate may be an insulator or a semiconductor of a variety of doping concentrations and profiles and may, for example, be a semiconductor substrate of the type used in the manufacture of integrated circuits. Exposed "silicon" or "polysilicon" of the patterned substrate is predominantly Si but may include minority concentrations of other elemental constituents such as nitrogen, oxygen, hydrogen and carbon. Exposed "silicon" or "polysilicon" may consist of or consist essentially of silicon. Exposed "silicon oxide" of the patterned substrate is predominantly $SiO_2$ but may include minority concentrations of other elemental constituents such as nitrogen, hydrogen and carbon. In embodiments, silicon oxide layers formed using the methods taught herein consist essentially of or consist of silicon and oxygen. Exposed "silicon nitride" of the patterned substrate is predominantly silicon and nitrogen but may include minority concentrations of other elemental constituents such as oxygen, hydrogen and carbon. "Exposed silicon nitride" may consist essentially of or consist of silicon and nitrogen.

The term "precursor" is used to refer to any process gas which takes part in a reaction to either remove material from or deposit material onto a surface. "Plasma effluents" describe gas created in a plasma region and reacting or available for reaction at the surface of the patterned substrate. Plasma effluents are in an "excited state" wherein at least some of the gas molecules are in vibrationally-excited, dissociated and/or ionized states. A "radical precursor" is used to describe plasma effluents (a gas in an excited state which is exiting a plasma) which participate (or are at least available to participate) in a reaction to deposit material on a surface. The phrase "inert gas" refers to any gas which does not form chemical bonds when being incorporated into a layer. Exemplary inert gases include noble gases but may include other gases so long as no chemical bonds are formed when (typically) trace amounts are trapped in a layer.

The term "gap" is used with no implication that the geometry has a large length-to-width aspect ratio. The gaps described herein may be high aspect ratio gaps having a high depth-to-width aspect ratio in embodiments. Viewed from above the surface, gaps may appear circular, oval, polygonal, rectangular, or a variety of other shapes. The term "gap" refers to a "trench" or a "via". A length-to-width aspect ratio of the via may be about 1:1, as viewed from above, whereas a length-to-width aspect ratio of the trench may be greater than 10:1. A trench may be in the shape of a moat around an island of material in which case the length-to-width aspect ratio would be the circumference divided by the width of the gap averaged around the circumference. The term "via" is used to refer to a low length-to-width aspect ratio trench which may or may not be filled with metal to form a vertical electrical connection.

Having disclosed several embodiments, it will be recognized by those of skill in the art that various modifications, alternative constructions, and equivalents may be used without departing from the spirit of the disclosed embodiments. Additionally, a number of well-known processes and elements have not been described to avoid unnecessarily obscuring the embodiments described herein. Accordingly, the above description should not be taken as limiting the scope of the claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the embodiments described, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or operations, but they do not preclude the presence or addition of one or more other features, integers, components, operations, acts, or groups.

The invention claimed is:

1. A method of forming a silicon oxide layer, the method comprising:
  placing a patterned substrate in a substrate processing region of a substrate processing chamber, wherein the patterned substrate comprises a high aspect ratio gap;
  (i) flowing a silicon-containing precursor into the substrate processing region and forming a silicon-containing plasma by applying a silicon-containing plasma power to the substrate processing region, wherein the patterned substrate is maintained at below 200° C. during operation (i),
  (ii) removing process effluents including unreacted silicon-containing precursor from the substrate processing region,
  (iii) flowing an oxygen-containing precursor into the substrate processing region and forming an oxygen-containing plasma by applying an oxygen-containing plasma power to the substrate processing region, wherein the patterned substrate is maintained at below 200° C. during operation (iii), and (iv) removing process effluents including unreacted oxygen-containing precursor from the substrate processing region.

2. The method of claim 1 wherein the silicon-containing plasma power is between 500 watts and 2,000 watts.

3. The method of claim 1 wherein the silicon-containing precursor comprises one or more of dimethylsilane, trimethylsilane, tetramethylsilane, tetramethylorthosilicate, tetraethylorthosilicate, octamethyltrisiloxane, octamethylcyclotetrasiloxane, tetramethyldimethyldimethoxydisilane, tetramethylcyclotetrasiloxane, dimethyldimethoxysilane, diethoxymethylsilane, methyltriethoxysilane, triethoxysilane, phenyldimethylsilane and phenylsilane.

4. The method of claim 1 wherein the oxygen-containing precursor comprises one or more of molecular oxygen ($O_2$), ozone ($O_3$), nitric oxide, nitrogen dioxide and nitrous oxide.

5. The method of claim 1 wherein a depth-to-width aspect ratio of the high aspect ratio gap is at least 4:1.

6. The method of claim 1 wherein operations i-iv are repeated an integral number of times to achieve a target thickness of silicon oxide.

7. The method of claim 1 wherein a depth of the high aspect ratio gap is greater than 1 μm.

8. The method of claim 1 wherein a temperature of the patterned substrate is maintained at below 200° C. during operations i) and iii).

9. The method of claim 1 wherein operations i, ii, iii, and iv occur in the recited order.

10. The method of claim 1 wherein a pressure within the substrate processing region is between 0.5 Torr and 20 Torr during operation i.

11. The method of claim 1 wherein the oxygen-containing plasma power is between 500 watts and 2,000 watts.

12. A method of forming a silicon oxide layer, the method comprising:
   placing a patterned substrate in a substrate processing region of a substrate processing chamber, wherein the patterned substrate comprises a high aspect ratio gap;
   (i) flowing an oxygen-containing precursor into the substrate processing region and forming an oxygen-containing plasma by applying an oxygen-containing plasma power to the substrate processing region, wherein the patterned substrate is maintained at below 200° C. during operation (i),
   (ii) removing process effluents including unreacted oxygen-containing precursor from the substrate processing region,
   (iii) flowing a silicon-containing precursor into the substrate processing region and forming a silicon-containing plasma by applying a silicon-containing plasma power to the substrate processing region, wherein the patterned substrate is maintained at below 200° C. during operation (iii), and
   (iv) removing process effluents including unreacted silicon-containing precursor from the substrate processing region.

13. The method of claim 12 wherein operations i-iv deposit between 1 nm and 15 nm of silicon oxide on the patterned substrate.

14. The method of claim 12 wherein the silicon-containing precursor comprises a Si—O:Si ratio of 4:1.

15. The method of claim 12 wherein the high aspect ratio gap has a width of between 1 μm and 15 μm.

16. The method of claim 12 wherein a pressure within the substrate processing region is between 0.5 Torr and 20 Torr during operation i.

* * * * *